United States Patent
Yamakawa et al.

(10) Patent No.: US 7,466,253 B2
(45) Date of Patent: Dec. 16, 2008

(54) INTEGRATED CIRCUIT, SELF-TEST METHOD FOR THE INTEGRATED CIRCUIT, AND OPTICAL DISC APPARATUS INCLUDING THE INTEGRATED CIRCUIT

(75) Inventors: Hideyuki Yamakawa, Tokyo (JP); Yukiyasu Tatsuzawa, Tokyo (JP); Takayuki Mori, Tokyo (JP); Takahiro Nango, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/830,705

(22) Filed: Jul. 30, 2007

(65) Prior Publication Data
US 2008/0030386 A1 Feb. 7, 2008

(30) Foreign Application Priority Data
Aug. 3, 2006 (JP) ............................ 2006-212114

(51) Int. Cl.
*H03M 1/10* (2006.01)
(52) U.S. Cl. ...................................... 341/120; 341/155
(58) Field of Classification Search ................. 341/155, 341/118, 120, 143; 327/141, 147, 156, 175
See application file for complete search history.

(56) References Cited

U.S. PATENT DOCUMENTS 4,196,475 A 4/1980 Hall
4,641,246 A * 2/1987 Halbert et al. ............... 341/163
5,146,155 A 9/1992 Trinh Van et al.
6,882,159 B1 * 4/2005 Cowan et al. ................ 324/537
7,139,329 B2 * 11/2006 Takahiko ..................... 375/316
2007/0008204 A1 * 1/2007 Rutten et al. ................. 341/155
2008/0048726 A1 * 2/2008 Hafed ............................ 327/9

FOREIGN PATENT DOCUMENTS

| JP | A 57-106870 | 7/1982 |
| JP | A 61-086664 | 5/1986 |
| JP | A 04-212072 | 8/1992 |
| JP | A 08-129055 | 5/1996 |
| JP | A 11-98016 | 4/1999 |

\* cited by examiner

*Primary Examiner*—Peguy JeanPierre
(74) *Attorney, Agent, or Firm*—Knobbe, Martens, Olson & Bear LLP (57) ABSTRACT

An integrated circuit includes an AD converter and a self-test circuit configured to test the AD converter. The self-test circuit includes a clock generator which generates a clock for allowing the AD converter to AD-convert an external sine wave signal externally input, a sine wave generator which generates an internal sine wave signal in digital form, a subtractor which determines a differential signal between the AD-converted external sine wave signal and the internal sine wave signal, a PLL device which allows a phase-locked loop receiving the differential signal as an input to control a phase of the internal sine wave signal such that the internal sine wave signal is in phase with the external sine wave signal, and a root mean square calculator which calculates a root mean square of the differential signal to generate a diagnostic signal corresponding to the AD converter.

11 Claims, 5 Drawing Sheets

PHASE LEAD

FIG. 3A

PHASE LAG

INTEGRATED CIRCUIT, SELF-TEST METHOD FOR THE INTEGRATED CIRCUIT, AND OPTICAL DISC APPARATUS INCLUDING THE INTEGRATED CIRCUIT

CROSS-REFERENCE TO RELATED APPLICATIONS

This application claims the benefit of priority of Japanese Patent Application No. 2006-212114, filed Aug. 3, 2006, the entire contents of which are incorporated herein by reference.

BACKGROUND

1. Field

The present invention relates to an integrated circuit, a self-test method for the integrated circuit, and an optical disc apparatus including the integrated circuit. In particular, the present invention relates to an integrated circuit including an AD converter, a self-test method for the integrated circuit, and an optical disc apparatus including the integrated circuit.

2. Description of the Related Art

Today, the frequency of reproduced signals from optical discs is being significantly increased by the emergence of high-density recording optical discs, such as HD DVDs. Accordingly, the conversion speed of an AD converter for sampling and converting reproduced signals to digital form is also being increased.

At the same time, to maintain the quality of reproduced signals at a high level, it is very important not only to ensure high conversion speed, but also to ensure high conversion performance (such as high linearity, low noise performance, or low distortion performance) of an AD converter.

Therefore, performance evaluations and quality assurance for an AD converter are very important issues that will affect performance evaluations and quality assurance for an optical disc apparatus.

Conventionally, there have been proposed various evaluation methods and apparatuses for evaluating the performance of AD converters. For example, JP-A 11-98016 discloses a technique relating to an evaluation apparatus which evaluates the performance of AD converters. In operation, this evaluation apparatus inputs a sine wave to an AD converter, temporarily stores digital data output from the AD converter in a waveform memory, reads the digital data from the waveform memory to perform signal processing for frequency transform (such as FFT or wavelet transform) on the digital data, and thus evaluates the performance of the AD converter.

For evaluating an AD converter, it is important not only to evaluate the individual performance of the AD converter, but also to evaluate the performance of the AD converter when it is included in an apparatus and operates in the operating environment of peripheral circuitry. In other words, it is necessary to provide the capability of performing self-testing and performance evaluations on the AD converter when it is included in the apparatus.

In response to demands for smaller and lower cost optical disc apparatuses, there have been developed configurations in which an AD converter and many other digital circuits are built in a single, highly integrated circuit. In such a configuration, it is technically difficult to externally extract the output of an AD converter alone at a high speed.

In this case, incorporating a self-test circuit into the highly integrated circuit, instead of extracting the output of the AD converter to the outside of the highly integrated circuit, is effective. However, the configuration disclosed in JP-A 11-98016 cannot be regarded as a reasonable solution in terms of cost and use efficiency of an integrated circuit, since the waveform memory and large circuitry involved in signal processing for frequency transform are included as part of a self-test circuit in the integrated circuit.

SUMMARY OF THE INVENTION

The present invention has been made in view of the circumstances described above. An object of the present invention is to provide an integrated circuit including an AD converter and capable of performing self-testing with a relatively simple configuration while making an adequate performance evaluation, a self-test method for the integrated circuit, and an optical disc apparatus including the integrated circuit.

To solve the problems described above, an integrated circuit according to an aspect of the present invention includes an AD converter and a self-test circuit configured to test the AD converter. The self-test circuit includes a clock generator configured to generate a clock for allowing the AD converter to AD-convert an external sine wave signal externally input, a sine wave generator configured to generate an internal sine wave signal in digital form, a subtractor configured to determine a differential signal between the AD-converted external sine wave signal and the internal sine wave signal, a PLL device configured to allow a phase-locked loop which receives the differential signal as an input to control a phase of the internal sine wave signal such that the internal sine wave signal is in phase with the external sine wave signal, and a root mean square calculator configured to calculate a root mean square of the differential signal to generate a diagnostic signal corresponding to the AD converter.

To solve the problems described above, an optical disc apparatus according to another aspect of the present invention includes a disc motor configured to rotate an optical disc, a pickup configured to read data recorded on a recording surface of the optical disc, and an integrated circuit. The integrated circuit includes an AD converter configured to AD-convert a reproduced signal read by the pickup and a self-test circuit configured to test the AD converter. The self-test circuit includes a clock generator configured to generate a clock for allowing the AD converter to AD-convert an external sine wave signal externally input, a sine wave generator configured to generate an internal sine wave signal in digital form, a subtractor configured to determine a differential signal between the AD-converted external sine wave signal and the internal sine wave signal, a PLL device configured to allow a phase-locked loop which receives the differential signal as an input to control a phase of the internal sine wave signal, and a root mean square calculator configured to calculate a root mean square of the differential signal to generate a diagnostic signal corresponding to the AD converter.

To solve the problems described above, a self-test method for an integrated circuit including an AD converter according to still another aspect of the present invention includes the steps of generating a clock for allowing the AD converter to AD-convert an external sine wave signal externally input, AD-converting the external sine wave signal using the clock, generating an internal sine wave signal in digital form, determining a differential signal between the AD-converted external sine wave signal and the internal sine wave signal, allowing a phase-locked loop which receives the differential signal as an input to control a phase of the internal sine wave signal such that the internal sine wave signal is in phase with the external sine wave signal, calculating a root mean square of the differential signal to generate a diagnostic signal corresponding to the AD converter.

With the foregoing integrated circuit including the AD converter, self-test method for the integrated circuit, and optical disc apparatus including the integrated circuit according to the present invention, the integrated circuit can perform self-testing with a relatively simple configuration while making an adequate performance evaluation.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Embodiments of an integrated circuit, a self-test method for the integrated circuit, and an optical disc apparatus including the integrated circuit according to the present invention will now be described with reference to the attached drawings.

(1) Integrated Circuit

Figure 1:
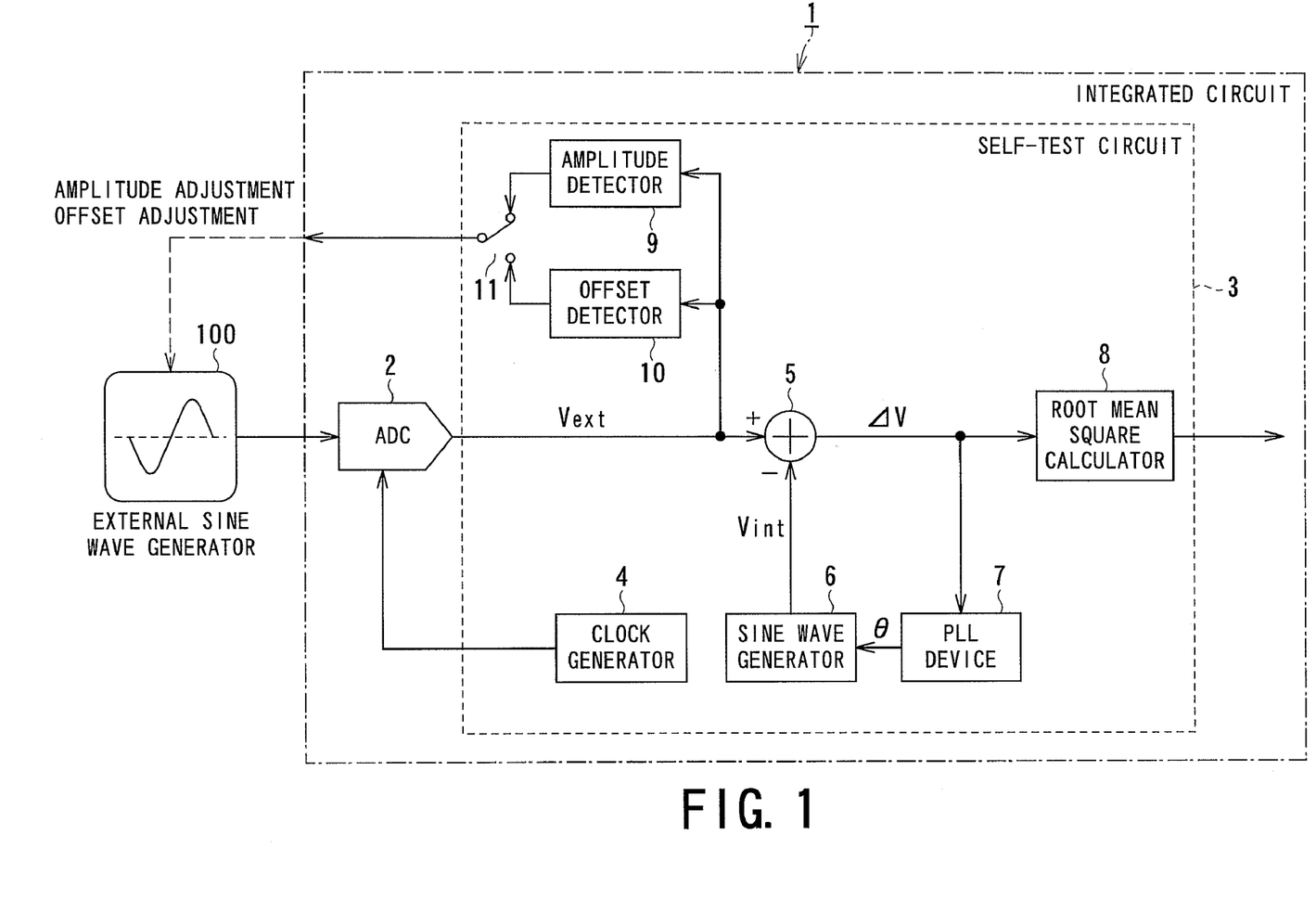
FIG. 1 illustrates an exemplary configuration of an integrated circuit according to a first embodiment of the present invention.

FIG. 1 illustrates an exemplary configuration of an integrated circuit 1 according to a first embodiment of the present invention.

The integrated circuit 1 includes an AD converter (ADC) 2 and a self-test circuit 3. The AD converter 2 converts a reproduced analog signal from a DVD or the like into a digital signal. The conversion speed of the AD converter 2 is as high as 100 MHz or more.

The self-test circuit 3 tests the AD converter 2 for a manufacturing defect or performance degradation and makes a diagnosis.

While FIG. 1 illustrates the integrated circuit 1 which includes the AD converter 2 and the self-test circuit 3 for testing the AD converter 2, the integrated circuit 1 may further includes a digital circuit, such as a demodulating circuit for demodulating a signal reproduced from an optical disc and converted to digital form.

The self-test circuit 3 includes a clock generator 4, a subtractor 5, a sine wave generator 6, a PLL device 7, a root mean square calculator 8, an amplitude detector 9, an offset detector 10, and a switching device 11.

The clock generator 4 generates a clock for allowing the AD converter 2 to sample a sine wave signal (external sine wave signal Vext) that is externally input when the integrated circuit 1 performs testing. Here, an appropriate clock frequency is determined by a processor (not shown) or the like.

The sine wave generator 6 generates, in digital form, a sine wave signal (internal sine wave signal Vint) to be compared with the external sine wave signal Vext obtained by AD conversion. The internal sine wave signal Vint is generated on the basis of a controlled phase quantity $\theta$ output from the PLL device 7.

The subtractor 5 performs a subtraction between the external sine wave signal Vext and the internal sine wave signal Vint along the time axis to generate a differential signal $\Delta V$.

In the PLL device 7, a phase-locked loop receiving the differential signal $\Delta V$ as an input controls the phase of the internal sine wave signal Vint such that the internal sine wave signal Vint is in phase with the external sine wave signal Vext.

The root mean square calculator 8 calculates the root mean square of the differential signal $\Delta V$. The resulting differential signal $\Delta V$ is output, as a diagnostic signal, to the outside of the self-test circuit 3.

The amplitude detector 9 detects an amplitude value (e.g., peak-to-peak value) of the external sine wave signal Vext and outputs the detected amplitude value via the switching device 11 to the outside of the integrated circuit 1. This amplitude value is used for adjusting the amplitude of an external sine wave generator 100 serving as an oscillation source of the external sine wave signal Vext.

The offset detector 10 detects an offset value of the external sine wave signal Vext and outputs the detected offset value via the switching device 11 to the outside of the integrated circuit 1. This offset value is detected, for example, by short-circuiting the input terminals of the AD converter 2 to drive the input terminal voltage to zero and averaging the resulting output of the AD converter 2.

The switching device 11 is a switch that selects and outputs either one of a detected offset value and a detected amplitude to the outside of the integrated circuit 1.

An operation of the integrated circuit 1 configured as described above will now be described.

Typical examples of methods for evaluating the performance of AD converters include a static performance evaluation method and a dynamic performance evaluation method. The static performance evaluation method involves application of a direct current voltage to an AD converter, while the dynamic performance evaluation method involves application of a periodic signal, such as a sine wave signal, to an AD converter. Known examples of the dynamic performance evaluation method include an FFT method and a curve-fitting method (e.g., see JP-A 11-98016).

An FFT method is a method in which a sine wave signal is externally input to an AD converter and the AD-converted sine wave signal is subjected to FFT. Then, the performance of the AD converter is evaluated on the basis of the result of the FFT. In the FFT method, the number of effective bits of the AD converter is determined on the basis of the ratio of basic frequency components (S) to all the other frequency components (N) (i.e., S/N (dB)).

Like the FFT method described above, a curve-fitting method is a method in which a sine wave signal is externally input to an AD converter. However, the curve-fitting method involves determining parameters of an ideal sine wave such that a square error between the AD-converted sine wave signal and the ideal sine wave is minimized. The determined parameters define the waveform of the ideal sine wave. Then, the number of effective bits of the AD converter is estimated from the square error between the ideal sine wave and the AD-converted sine wave signal. The value of the obtained square error corresponds to (N) in the FFT method, and the amplitude of the AD-converted sine wave signal corresponds to (S) in the FFT method. In other words, while (N) is determined along the frequency axis in the FFT method, (N) is determined along the time axis in the curve-fitting method.

The self-test circuit 3 of the present embodiment implements an evaluation method based on a concept similar to that of the foregoing curve-fitting method in real time.

More specifically, in the self-test circuit 3, the sine wave generator 6 generates "ideal sine wave" in the curve-fitting method in real time, while the subtractor 5 and the root mean square calculator 8 determine a square error between the generated "ideal sine wave" and the AD-converted external sine wave signal Vext in real time.

An ideal sine wave is determined by three parameters: offset, amplitude, and phase (which includes the concept of frequency). In the present embodiment, the phase of the internal sine wave signal Vint is controlled by the phase-locked loop in the PLL device 7 such that it coincides with the phase of the external sine wave signal Vext.

As for the offset and amplitude, the input side, that is, the external sine wave generator 100 is adjusted such that the offset and amplitude of the external sine wave signal Vext are equal to those of the internal sine wave signal Vint. Since the internal sine wave signal Vint is a signal generated in digital form, the offset and amplitude of the internal sine wave signal Vint are known values that can be precisely determined in advance.

Therefore, the external sine wave generator 100 is adjusted such that the offset and amplitude of the external sine wave signal Vext that are detected by the offset detector 10 and the amplitude detector 9, respectively, are equal to the known offset and amplitude of the internal sine wave signal Vint.

Since the offset and amplitude do not significantly change with time, it is possible to manually adjust the external sine wave generator 100. Alternatively, an additional function that allows automatic adjustment of the external sine wave generator 100 may be provided.

Figure 2:
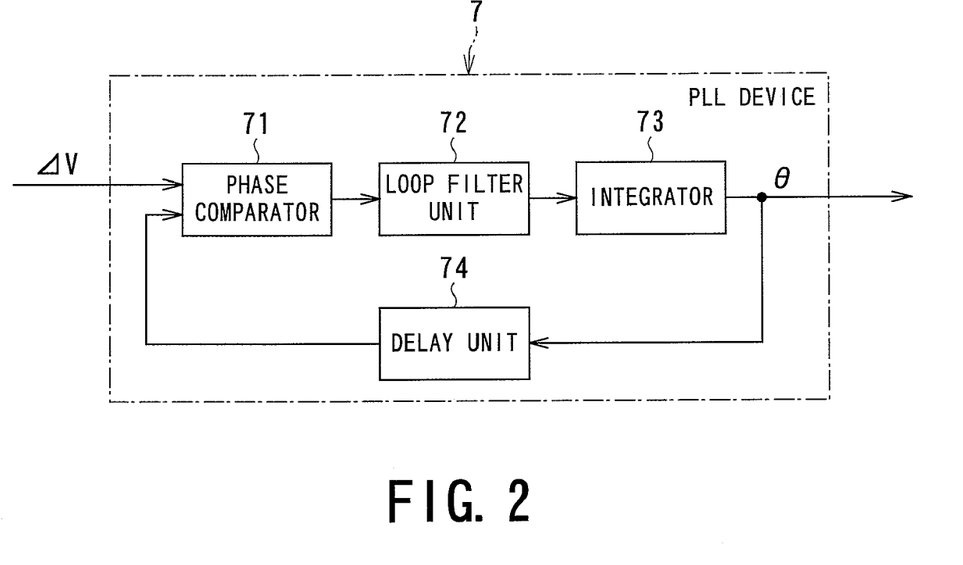
FIG. 2 illustrates an exemplary configuration of a PLL device.

Next, phase control performed by the PLL device 7 will be described.

FIG. 2 illustrates an exemplary configuration of the PLL device 7 according to the present embodiment. The PLL device 7 includes a phase comparator 71, a loop filter unit 72, an integrator 73, and a delay unit 74.

The phase comparator 71 of the present embodiment receives the differential signal $\Delta V$ between the external sine wave signal Vext and the internal sine wave signal Vint. Then, from this differential signal $\Delta V$ and the controlled phase quantity $\theta$ which is the output of the integrator 73, the phase comparator 71 determines a phase error $\Delta \phi$ between the external sine wave signal Vext and the internal sine wave signal Vint.

Figure 3A:
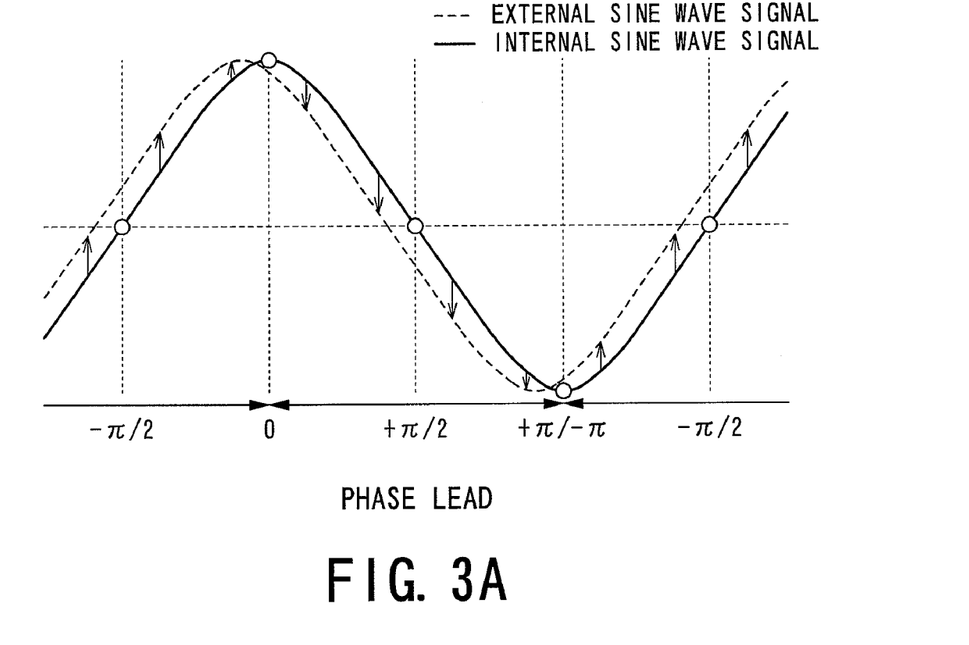
FIG. 3A and FIG. 3B illustrate an operation concept of a phase comparator.
Figure 3B:
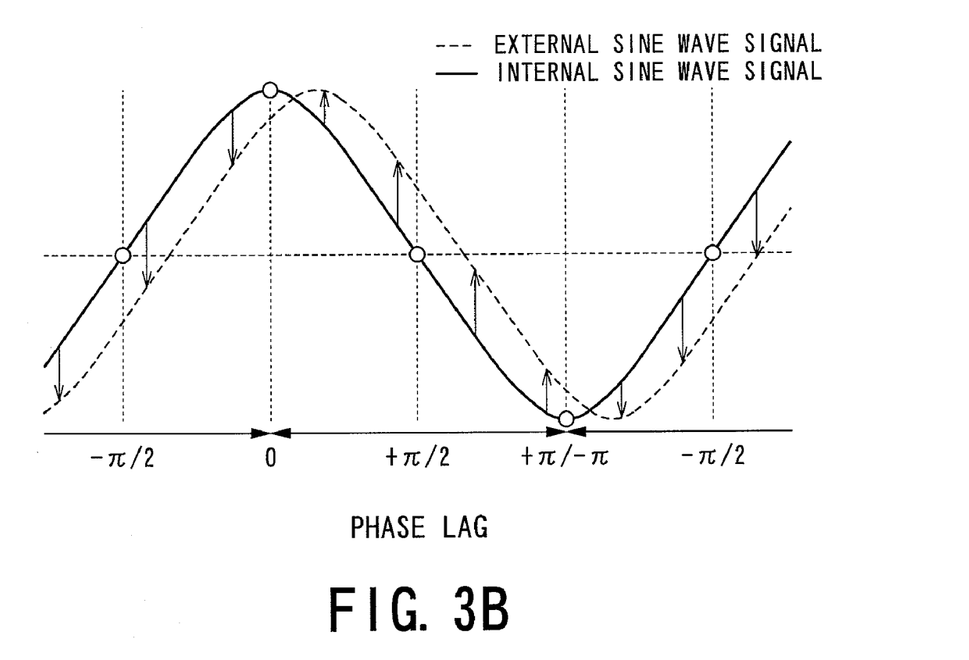

FIGS. 3A and 3B illustrate the concept of a method for determining the phase error $\Delta \phi$. In FIGS. 3A and 3B, the external sine wave signal Vext is indicated by a dashed line and the internal sine wave signal Vint is indicated by a solid line.

FIG. 3A illustrates a state where the phase of the internal sine wave signal Vint leads that of the external sine wave signal Vext. The horizontal axis of FIG. 3A represents the phase (controlled phase quantity $\theta$) of the internal sine wave signal Vint. The differential signal $\Delta V$ between the external sine wave signal Vext and the internal sine wave signal Vint is both the output of the subtractor 5 and the input of the PLL device 7.

As can be seen from FIG. 3A, the differential signal $\Delta V$ has a negative value when the controlled phase quantity $\theta$, which is the input of the sine wave generator 6, is in the range of $0 \leq \theta < \pi$, while the differential signal $\Delta V$ has a positive value when the controlled phase quantity $\theta$ is in the range of $\pi \leq \theta < 2\pi$.

On the other hand, FIG. 3B illustrates a state where the phase of the internal sine wave signal Vint lags that of the external sine wave signal Vext. As can be seen from FIG. 3B, the differential signal $\Delta V$ has a positive value when the controlled phase quantity $\theta$, which is the input of the sine wave generator 6, is in the range of $0 \leq \theta < \pi$, while the differential signal $\Delta V$ has a negative value when the controlled phase quantity $\theta$ is in the range of $\pi \leq \theta < 2\pi$.

On the basis of these characteristics, the phase comparator 71 of the present embodiment determines the phase error $\Delta \phi$ using the differential signal $\Delta V$ and the controlled phase quantity $\theta$ as follows:

$$\Delta \phi = \text{sign}(\theta) * \Delta V$$

$$\text{sign}(\theta) = -1 \text{ when } 0 \leq \theta < \pi$$

$$\text{sign}(\theta) = +1 \text{ when } \pi \leq \theta < 2\pi$$

The phase error $\Delta \phi$ determined from the above-described equations is filtered by the loop filter unit 72 and then integrated by the integrator 73. This generates the controlled phase quantity $\theta$, on the basis of which the sine wave generator 6 generates the internal sine wave signal Vint.

The phase-locked loop operates to make the phase error $\theta \phi$ zero. Therefore, when the phase-locked loop is locked, the phase of the internal sine wave signal Vint coincides with that of the external sine wave signal Vext (i.e., the internal sine wave signal Vint and the external sine wave signal Vext are in phase).

The internal sine wave signal Vint generated by the sine wave generator 6 is a reference sine wave signal to be compared with the external sine wave signal Vext and thus is required to have a high degree of purity. However, by using known techniques for constructing relatively simple digital circuits, a sine wave can be generated with sufficiently high precision.

The delay unit 74 in the PLL device 7 determines the amount of processing delay in the sine wave generator 6 and subtractor 5 to be compensated for.

Thus, the internal sine wave signal Vint that is in phase with the external sine wave signal Vext is generated. At the same time, as described above, the external sine wave generator 100 is adjusted such that the offset and amplitude of the external sine wave signal Vext are equal to those of the internal sine wave signal Vint.

Therefore, the relationship between the external sine wave signal Vext and the internal sine wave signal Vint at the input point of the subtractor 5 is the same as that between an input sine wave and an ideal sine wave in the foregoing curve-fitting method conventionally used. Thus, a root mean square value of the differential signal $\Delta V$, the root mean square value being output from the root mean square calculator 8, can be used as an index with which the number of effective bits indicating the precision of the AD converter 2 can be estimated.

If a root mean square value output from the root mean square calculator 8 exceeds a predetermined threshold value, it is determined that the AD converter 2 has some manufacturing defect.

The configuration of the self-test circuit 3 illustrated in FIGS. 1 and 2 may seem complex at first glance. However, the self-test circuit 3 does not require a large waveform memory or the like and can basically be composed of a relatively simple digital logic circuit. Therefore, the ratio of the size of the self-test circuit 3 to the overall size of a highly integrated circuit available today is not high.

Additionally, unlike a raw sampled signal, a diagnostic signal output from the self-test circuit 3 is not a high-speed signal. The diagnostic signal is a low-speed signal that is in the form of a root mean square value which can be substantially regarded as a constant. Therefore, the configuration of an interface through which this diagnostic signal is output to the outside of the self-test circuit 3 can be made extremely simple. Moreover, basic processing involved in determining the quality of the AD converter 2 is completed in the self-test circuit 3. Therefore, outside the self-test circuit 3, the quality of the AD converter 2 can be determined simply by comparing the root mean square value output from the self-test circuit 3 with a threshold value. Alternatively, this quality determination function may be incorporated in the self-test circuit 3.

With the foregoing integrated circuit 1 of the present embodiment, the integrated circuit 1 including an AD converter can perform testing or a self-diagnosis with a relatively simple configuration while making an adequate performance evaluation.

(2) Testing Procedure

A testing procedure performed by the integrated circuit 1 of the first embodiment will now be described.

In the first step of testing, the frequency, amplitude, and offset of a sine wave generated by the external sine wave generator 100 are adjusted. The frequency may be approximately set to a predetermined frequency at which measurement is to be made.

For the adjustment of offset, the output amplitude of the external sine wave generator 100 is set to zero (or the input terminals of the AD converter 2 are short-circuited), the clock generator 4 is set to generate a clock of a predetermined frequency, and the switching device 11 is switched to the side of the offset detector 10. Subsequently, the output DC level of the external sine wave generator 100 (or the input DC level of the AD converter 2) is adjusted such that the output of the offset detector 10 is equal to a known offset of the internal sine wave signal Vint (e.g. zero).

Next, the switching device 11 is switched to the side of the amplitude detector 9 to allow the external sine wave generator 100 to generate a sine wave of appropriate amplitude. Subsequently, the amplitude of the sine wave generated by the external sine wave generator 100 is adjusted such that an amplitude value detected by the amplitude detector 9 is equal to the value of a known amplitude of the internal sine wave signal Vint.

In the second step, the frequency of a sine wave generated by the external sine wave generator 100 and the frequency of a clock generated by the clock generator 4 are set to values with respect to each of which testing is to be performed. Then, after a certain period of time elapses, the PLL device 7 is locked and a root mean square value can be obtained.

When testing is to be performed with respect to a plurality of frequencies, the second step may be repeated multiple times. Thus, the AD converter 2 included in the integrated circuit 1 can be tested.

(3) Second Embodiment

Figure 4:
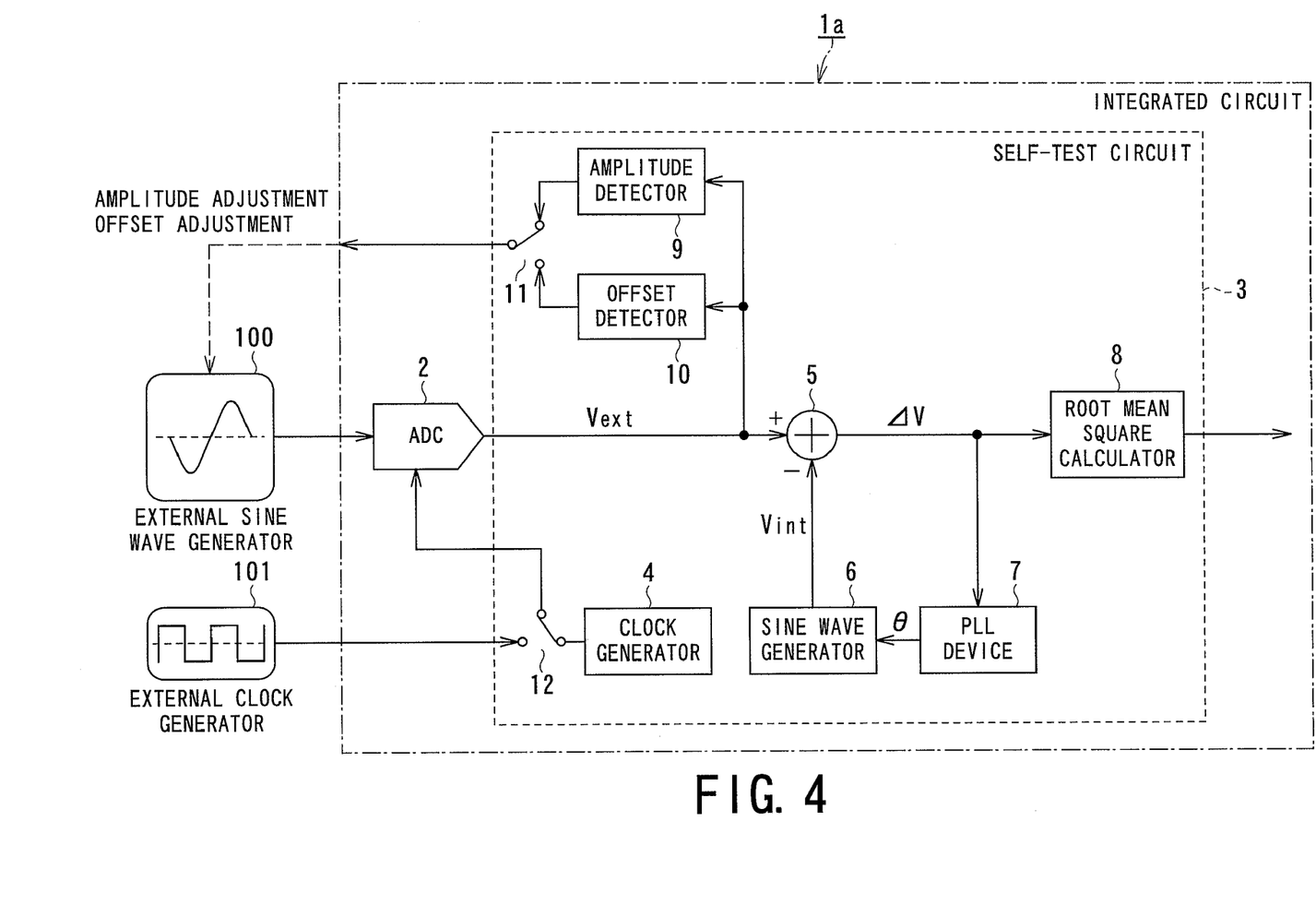
FIG. 4 illustrates an exemplary configuration of an integrated circuit according to a second embodiment of the present invention.

FIG. 4 illustrates an exemplary configuration of an integrated circuit 1a according to a second embodiment of the present invention. The integrated circuit 1a of the second embodiment differs from the integrated circuit 1 (see FIG. 1) of the first embodiment in that a clock switching device 12 provided at the output end of the clock generator 4 selects either one of an external clock generated by an external clock generator 101 and an internal clock generated by the clock generator 4 and supplies the selected clock to the AD converter 2.

With this configuration, if an output value of the root mean square calculator 8 does not meet a predetermined criterion when the clock switching device 12 is switched to the side of the clock generator 4, and if the output value of the root mean square calculator 8 meets the predetermined criterion by switching the clock switching device 12 to the side of the external clock generator 101, it can be determined that a defect is caused by a problem with the clock generator 4. Conversely, if the output value of the root mean square calculator 8 still does not meet the criterion even if the clock switching device 12 is switched to the side of the external clock generator 101, it can be determined that a defect is caused by a problem with the AD converter 2.

As described above, with the integrated circuit 1a of the second embodiment, it is possible to identify which of the AD converter 2 and the clock generator 4 has a problem causing a defect. This makes it easy to reduce manufacturing defects of the integrated circuit 1a.

(4) Optical Disc Apparatus

Figure 5:
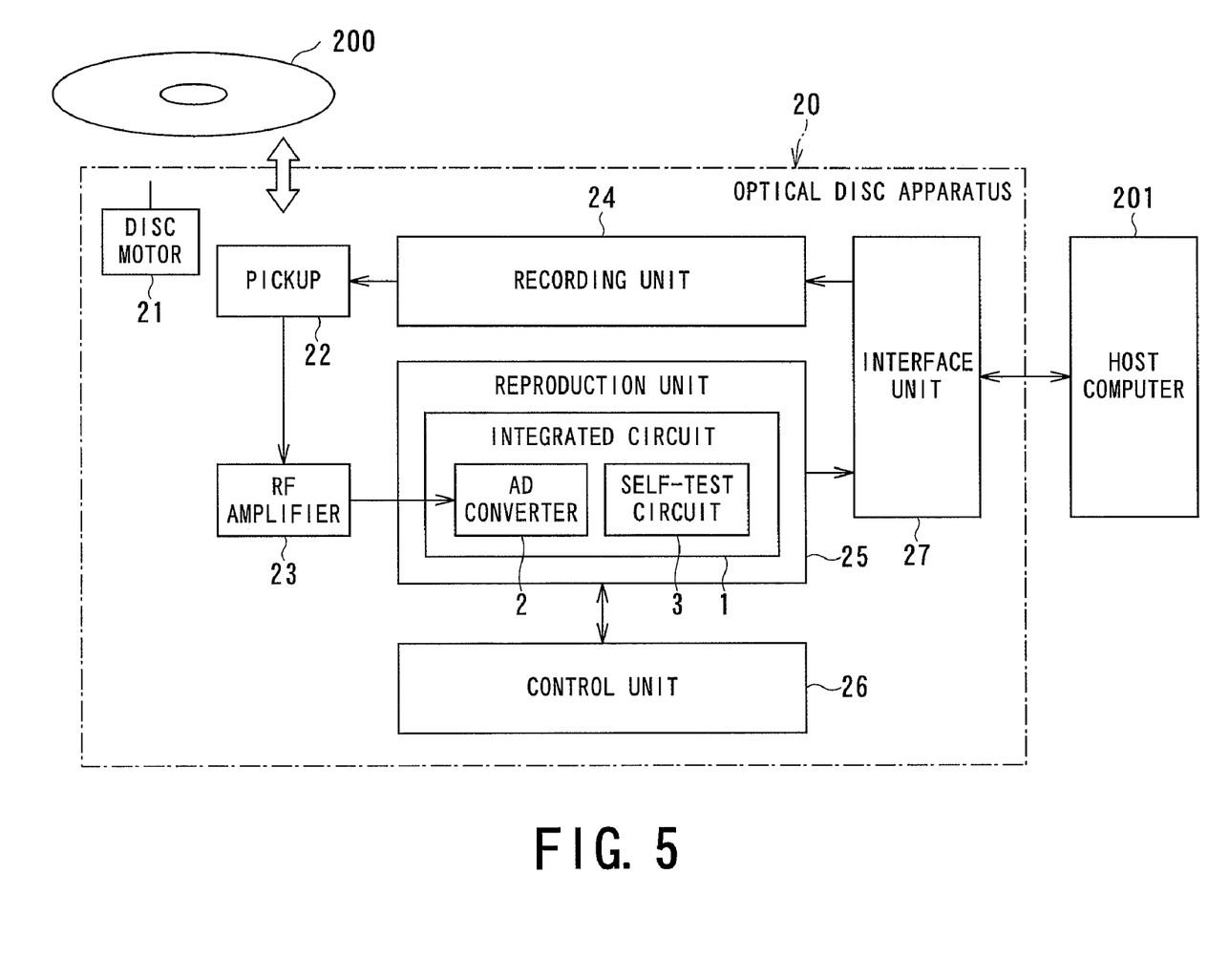
FIG. 5 illustrates an exemplary configuration of an optical disc apparatus according to an embodiment of the present invention.

FIG. 5 illustrates an exemplary configuration of an optical disc apparatus 20 which includes the integrated circuit 1 described above. As illustrated, the optical disc apparatus 20 includes a disc motor 21, a pickup 22, an RF amplifier 23, a recording unit 24, a reproduction unit 25, an interface unit 27, and a control unit 26. The disc motor 21 rotates an optical disc 200. The pickup 22 reads data from a recording surface of the optical disc 200 to output an analog reproduced signal. The RF amplifier 23 amplifies the amplitude of a reproduced signal to an appropriate level. The recording unit 24 converts recording data output from a host computer 201 into data recordable on the optical disc 200. The reproduction unit 25 demodulates a reproduced signal into data that can be output to the host computer 201. The interface unit 27 transmits and receives data to and from the host computer 201. The control unit 26 controls the entire optical disc apparatus 20.

The reproduction unit 25 has the integrated circuit 1 including the self-test circuit 3 and the AD converter 2 which AD-converts a reproduced signal.

In the optical disc apparatus 20 of the present embodiment, the integrated circuit 1 including the AD converter 2 is configured to easily perform testing. This makes it easy to reduce manufacturing defects in the optical disc apparatus 20.

The present invention is not limited to the embodiments described above, and constituent elements of the present invention may be modified and embodied within the scope of the present invention in an implementation phase. Additionally, various embodiments of the invention can be made by appropriately combining a plurality of constituent elements disclosed in the embodiments described above. For example, some of the constituent elements disclosed in the embodiments may be omitted. Furthermore, constituent elements in the different embodiments may be appropriately combined with each other.

What is claimed is:

1. An integrated circuit comprising:
   an AD converter; and
   a self-test circuit configured to test the AD converter, the self-test circuit comprising:
   a clock generator configured to generate a clock signal for allowing the AD converter to convert an external sine wave signal;
   a sine wave generator configured to generate an internal sine wave signal in digital form;
   a subtractor configured to generate a differential signal based on the converted external sine wave signal and the internal sine wave signal;
   a PLL device configured to allow a phase-locked loop, further configured to receive the differential signal as an input and to control a phase of the internal sine wave signal such that the internal sine wave signal is in phase with the external sine wave signal; and a root mean square calculator configured to calculate a root mean square of the differential signal to generate a diagnostic signal.

2. The integrated circuit according to claim 1, wherein the self-test circuit further comprises:

an offset detector configured to detect an offset of the converted external sine wave signal; and an amplitude detector configured to detect an amplitude of the converted external sine wave signal.

3. The integrated circuit according to claim 2, further comprising:

a switching device configured to select and externally output either the offset detected by the offset detector or the amplitude detected by the amplitude detector.

4. The integrated circuit according to claim 1, wherein PLL device comprises:

a phase comparator configured to determine a phase error between the converted external sine wave signal and the internal sine wave signal;

a loop filter unit configured to filter the phase error; and an integrator configured to integrate the filtered phase error.

5. The integrated circuit according to claim 1, further comprising:

a clock switching device configured to select and supply to the AD converter either the clock signal generated by the clock generator or an input from an external clock.

6. An optical disc apparatus comprising:

a disc motor configured to rotate an optical disc;

a pickup configured to read data recorded on a recording surface of the optical disc; and an integrated circuit comprising:

an AD converter configured to convert a reproduced signal read by the pickup; and a self-test circuit configured to test the AD converter, the self-test circuit comprising:

a clock generator configured to generate a clock signal for allowing the AD converter to convert an external sine wave signal;

a sine wave generator configured to generate an internal sine wave signal in digital form;

a subtractor configured to generate a differential signal based on the converted external sine wave signal and the internal sine wave signal;

a PLL device configured to allow a phase-locked loop, further configured to receive the differential signal as an input and to control a phase of the internal sine wave signal; and a root mean square calculator configured to calculate a root mean square of the differential signal to generate a diagnostic signal.

7. A self-test method for an integrated circuit including an AD converter, the self-test method comprising the steps of:

generating a clock signal for allowing the AD converter to convert an external sine wave signal;

converting the external sine wave signal using the clock signal;

generating an internal sine wave signal in digital form;

generating a differential signal based on the converted external sine wave signal and the internal sine wave signal;

allowing a phase-locked loop which receives the differential signal as an input to control a phase of the internal sine wave signal such that the internal sine wave signal is in phase with the external sine wave signal; and calculating a root mean square of the differential signal to generate a diagnostic signal.

8. The self-test method according to claim 7, further comprising the steps of:

detecting an offset of the converted external sine wave signal;

externally adjusting an offset of the external sine wave signal to make the detected offset zero;

detecting an amplitude of the converted external sine wave signal; and externally adjusting an amplitude of the external sine wave signal to make the detected amplitude equal to a predetermined value.

9. The self-test method according to claim 7, further comprising the step of:

selecting and outputting either the detected offset or the detected amplitude.

10. The self-test method according to claim 7, further comprising the steps of:

determining a phase error between the converted external sine wave signal and the internal sine wave signal;

filtering the phase error; and integrating the filtered phase error.

11. The self-test method according to claim 7, further comprising the step of:

selecting and supplying to the AD converter either the generated clock signal or an input from an external clock.

* * * * *